United States Patent [19]

Ohtani et al.

[11] Patent Number: 4,982,365
[45] Date of Patent: Jan. 1, 1991

[54] SEMICONDUCTOR MEMORY DEVICE WITH A POTENTIAL LEVEL-SETTING CIRCUIT

[75] Inventors: Takayuki Ohtani, Tokyo; Mitsuo Isobe, Yokohama, both of Japan

[73] Assignee: Kabushiki Kaisha Toshiba, Kawasaki, Japan

[21] Appl. No.: 476,137

[22] Filed: Feb. 7, 1990

Related U.S. Application Data

[63] Continuation of Ser. No. 123,385, Nov. 20, 1987, abandoned.

[30] Foreign Application Priority Data

Dec. 15, 1986 [JP] Japan ................................. 61-298395

[51] Int. Cl.[5] .............................................. G11C 7/00
[52] U.S. Cl. ................................. 365/189.11; 365/154; 365/202
[58] Field of Search .................... 365/189.11, 154, 156, 365/202

[56] References Cited

U.S. PATENT DOCUMENTS 4,780,847 10/1988 Ito ..................................... 365/154

4,874,686 11/1989 Suzuki et al. ................... 365/189.11

Primary Examiner—James W. Moffitt
Attorney, Agent, or Firm—Finnegan, Henderson, Farabow, Garrett, and Dunner

[57] ABSTRACT

During a data-clearing operation, while maintaining in the OFF state the transfer gate transistors in each of the static type memory cells associated with at least one column, the source of one of two drive transistors incorporated in the memory cell is set to a high potential level, and the source of the other drive transistor to a low level. As a result, the clearing operation is performed to a minimum of 1 column in the memory cell matrix. Due to the arrangement of the memory device, no address-selecting operation is required for selecting a memory cell during the clearing operation. Moreover, the clearing operation is carried out in a minimum unit of 1 column in the memory cell matrix. Consequently, the processing time for the clearing operation is reduced. Furthermore, the DC current flowing during the clearing operation is reduced, since the transfer gate transistor in the memory cell is maintained in the OFF state during the clearing operation, with the result that the power consumption is lowered.

6 Claims, 11 Drawing Sheets

SEMICONDUCTOR MEMORY DEVICE WITH A POTENTIAL LEVEL-SETTING CIRCUIT

This application is a continuation, of application Ser. No. 07/123,385, filed Nov. 20, 1987 now abandoned.

BACKGROUND OF THE INVENTION

The present invention relates to a semiconductor memory device, and particularly to the control of a clearing operation in a static random access memory (SRAM) device.

The capacity of a typical semiconductor memory has recently been increased to such an extent that the memory can be used in an image processing device. However, various new functions are required for the memory, so that it can be more advantageously applied to image processors. Such functions include, for example, the instantaneous clearing of the stored data, whereby data stored in some or all of the memory cells in the memory is cleared and "0" or "1" data is written in the cleared memory cells.

In a conventional general-purpose SRAM, reading or writing of data can be performed for only a memory cell of an address designated by an address signal. Therefore, when data stored in all the memory cells in the memory device is to be cleared, it is necessary to sequentially designate all the addresses while successively writing the data "0" or "1" in each memory cell.

Consequently, the same number of writing operations have to be performed as the number of bits to be cleared. With a 256 k bit SRAM comprising 32 k words×8 bits, for example, a processing time of about 3 ms (100 ns×32×1024) is required, with a required minimum writing time of 100 ns.

However, since such a long clearing process time is highly undesirable when the memory is incorporated in an image processing device in which high-speed operating characteristics are required, it is necessary, therefore, that the clearing process time be as short as possible.

Another disadvantage of the prior art memory is that during the clearing process, the same quantity of current as is flowing during the writing mode, flows through the bit lines and memory cells. Consequently, a large amount of power is consumed, and this should be avoided.

Figure 1:
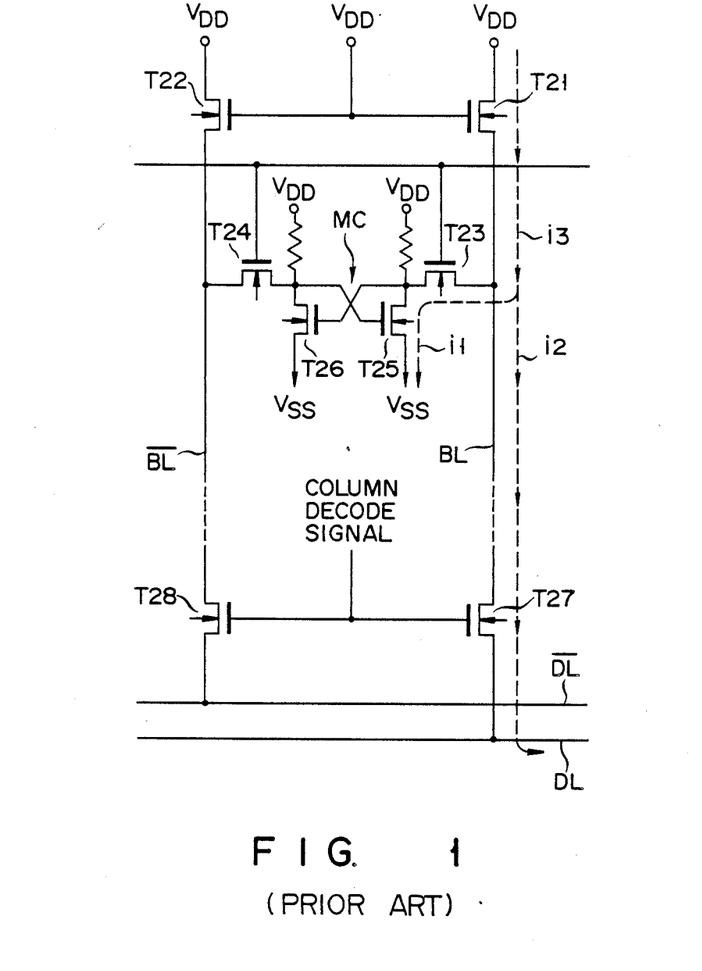
FIG. 1 is a circuit diagram of a memory section associated with one column of conventional semiconductor memory, particularly provided for explaining the DC current path formed during the clearing operations.

More explicitly, as is shown in FIG. 1, which shows an SRAM known in this field, current $i_3$, which is the sum of current $i_1$ and current $i_2$, flows during the clearing operation, where current $i_1$ denotes a current flowing through a power node of $V_{DD}$ potential, - load transistor $T_{21}$ on the bit line - bit line BL, a - memory cell MC (transistor $T_{23}$ for a transfer gate and - drive transistor $T_{25}$) and the - $V_{SS}$ potential, and current $i_2$ denotes a current flowing through the $V_{DD}$ potential power node, - load transistor $T_{21}$ on the bit line, - bit line BL, a - data write circuit (write transistor $T_{27}$ and - write data line DL, and the - $V_{SS}$ potential. Current $i_3$ normally amounts to about 1 milliampere per column. With a 256 k bit SRAM having 512 columns, for example, DC current as high as several ten milliamperes flows therethrough during the write operation. Accordingly, a significant reduction in power consumption is urgently required.

SUMMARY OF THE INVENTION

The present invention has been developed for the purpose of solving the problems of long processing time and wasteful power consumption currently associated with data clearing operations. One object of the present invention is to provide a semiconductor memory which can significantly reduce the processing time as well as the power consumption during data clearing operations.

According to the present invention there is provided a semiconductor memory device comprising:
a plurality of a memory cells arranged in the form of matrix constituted by a plurality of rows and columns, each memory including a flip-flop current constituted by two high-resistance load elements and two drive MOS transistors connected respectively to said load elements, and two transfer gate transistors connected respectively to the drains of said two MOS transistors; and
potential level setting means which sets, in a data-clear mode, the source of one of said two drive MOS transistors in each of the memory cells associated with at least one of said columns, to a high potential level, and sets the source of the other drive MOS transistor to a low potential level.

In the semiconductor memory device according to the present invention, the clearing operation is carried out in such a way that, while maintaining in the off state the transistors for transfer gates associated with at least one column memory cell, the source of one of two drive transistors in the memory cell is set to a highlevel potential and the source of the other drive transistor is set to a low-level potential, so that the clearing operation is performed to a minimum unit of 1 column of the memory cell matrix.

With such an arrangement of the memory device, no address selection process is required for selecting a memory cell during the clearing operation. Moreover, the processing time for the clearing operation becomes shorter, since the clearing operation is carried out in a minimum unit of 1 column in the memory cell matrix. Furthermore, the clearing operation is performed while the transistor for a transfer gate in the memory cell is maintained in the off state. As a result, the DC current flowing during the clearing operation is reduced, thereby resulting in lower power consumption.

DETAILED DESCRIPTION OF THE PREFERRED EMBODIMENTS

Several embodiments of the present invention will be described in detail, referring to the accompanying drawings.

Figure 2:
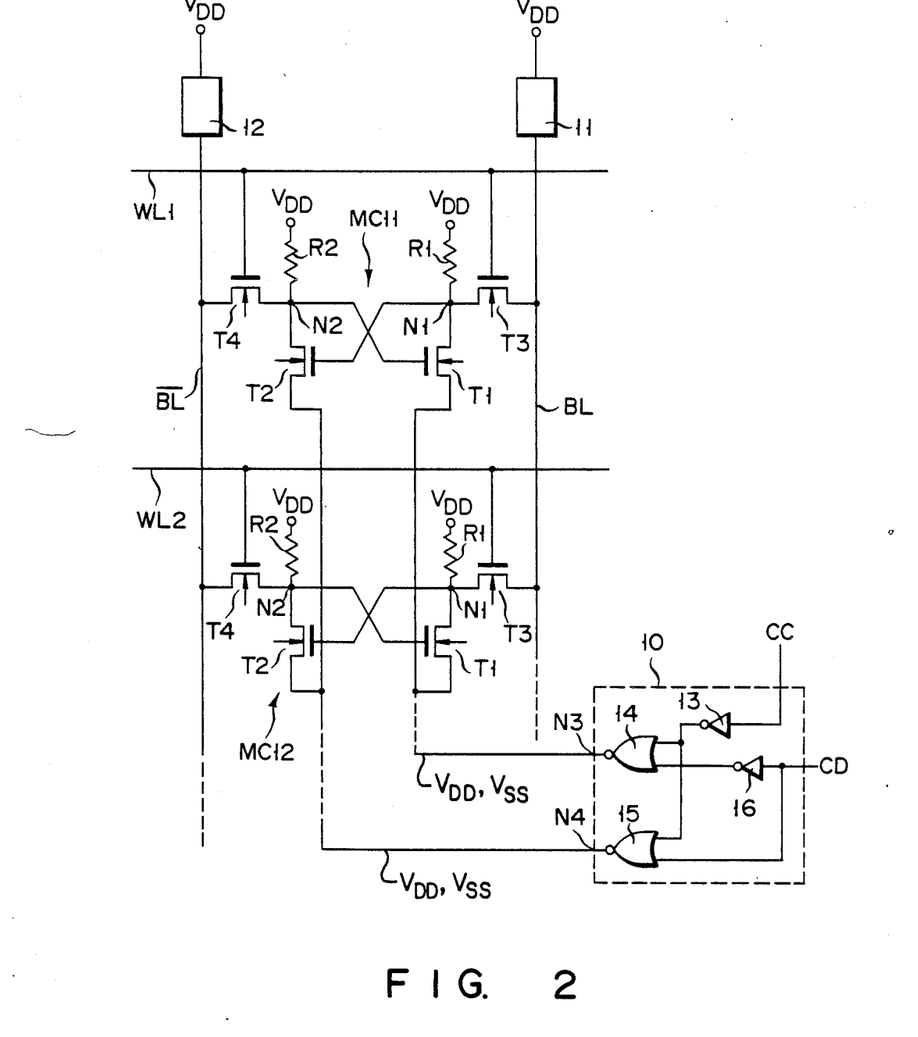
FIG. 2 is a circuit diagram of a memory section and a control circuit for clearing data, of a semiconductor memory according to an embodiment of the present invention.

FIG. 2 shows a memory circuit for one column in the memory cell matrix in SRAM and a clearing operation control circuit, i.e., a potential level setting circuit 10, associated with the memory circuit. BL and $\overline{BL}$ represent a pair of bit lines. The numeral 11 represents a bit line load circuit connected between bit line BL and a power node of $V_{DD}$ potential, and the numeral 12 represents a bit line load circuit connected between bit wire $\overline{BL}$ and $V_{DD}$ potential. $MC_{11}$ and $MC_{12}$ denote static type memory cells. $WL_1$ and $WL_2$ represent word lines connected to memory cells $MC_{11}$ and $MC_{12}$, respectively. Each of memory cells $MC_{11}$ and $MC_{12}$ comprises a flip-flop circuit including two drive N channel MOS transistors $T_1$ and $T_2$ and two high-load resistors $R_1$ and $R_2$. The node of resistor R1 and the drain of transistor $T_1$ forms input/output node $N_1$ of the flip-flop circuit, and the node of resistor $R_2$ and the drain of transistor $T_2$ forms input/output node $N_2$ of the flip flop circuit. Each of memory cells $MC_{11}$ and $MC_{12}$ further comprises N channel transistors $T_3$ and $T_4$ for transfer gates. Transistor $T_3$ is connected between bit line BL and the corresponding word line. Transistor $T_4$ is connected between bit line $\overline{BL}$ and the corresponding word line. The sources of drive transistors $T_1$ and $T_2$ in memory cells $MC_{11}$ and $MC_{12}$ are connected to the first and second output nodes $N_3$ and $N_4$ of clearing operation control circuit 10, respectively.

Clearing operation control circuit 10 receives clearing operation control signal CC and and clearing data signal CD. Based on the signals CC and CD, the potentials of output nodes $N_3$ and $N_4$ are set as follows. It is now assumed that the level of control signal CC becomes low, i.e., 0 level during the read/write operation of the memory, and becomes high, i.e., 1 level during the clearing operation. First and second output nodes $N_3$ and $N_4$ of control circuit 10 are both set to $V_{SS}$ potential, i.e., ground potential, when control signal CC is at the low level. When, however, the level of control signal CC is high, first and second output nodes $N_3$ and $N_4$ of control circuit 10 are set to different potentials. That is, one of output nodes $N_3$ and $N_4$ is set to the high level, i.e., $V_{DD}$ potential and, while, the other node is set to the low level, i.e., $V_{SS}$ potential. The correlation of the different potentials of first and second output nodes $N_3$ and $N_4$ determined according to the level of clearing data signal CD. More specifically, when clearing data signal CD is "1", first output node $N_3$ is set to $V_{DD}$ potential, while the second output node $N_4$ is set to $V_{SS}$ potential. On the contrary, when clearing data signal CD is "0", first output node $N_3$ is set to $V_{SS}$ potential, while second output node $N_4$ is set to $V_{DD}$ potential.

Now the configuration of clearing operation control circuit 10 is described.

Control circuit 10 comprises an inverter 13 that receives control signal CC and inverts its logic level, an inverter 16 that receives clearing data signal CD and inverts its logic level, a NOR gate 14 that receives the output signal of inverters 13 and clearing data signal CD and multiplies them logically and a NOR gate 15 that receives the output signal of inverters 13 and clearing data signal CD and multiplies them logically. The output terminal of NOR gate 14 constitutes node $N_3$ connected to the source of drive transistor $T_1$ in the flip-flop circuit of each of memory cells $MC_{11}$, $MC_{12}$, . . . The output terminal of NOR gate 15 constitutes node $N_4$ connected to the source of drive transistor $T_2$ in the flip-flop circuit of each of memory cell $MC_{11}$, $M_{12}$, . . . .

Now the operation of clearing operation control circuit 10 will be described.

Control signal CC is inverted in level by inverter 13 and, then, input to NOR gates 14 and 15. Clearing data signal CD is inverted in level by inverter 16 and, then, input to NOR gate 14. Clearing data signal CD is also directly input to NOR gate 15.

With the structure of control circuit 10, when the level of control signal CC is low and, consequently, the output level of inverter 13 becomes high, both output levels of NOR gate 14 (first output node $N_3$) and NOR gate 15 (second output node $N_4$) become low ($V_{SS}$ potential).

When the level of control signal CC is high, the output level of inverter 13 becomes low. While the level of control signal CC is high, when clearing data signal CD is "1" and, consequently, the output level of inverter 16 becomes low, the output level of NOR gate 14 becomes high ($V_{DD}$ potential) and the output of NOR gate 15 becomes $V_{SS}$ potential. On the other hand, while the level of control signal CC is high, when clearing data signal CD is "0" and, consequently, the output level of inverter 16 becomes high, the output levels of NOR gates 14 and 15 become $V_{SS}$ and $V_{DD}$ potentials, respectively.

Next, the operation of the memory will be described. During the read/write operation, control signal CC is "0", and both first and second output nodes $N_3$ and $N_4$ of control circuit 10 are set to $V_{SS}$ potential. This potential setting for read/write is the same as those in conventional memories known in this field. More specifically, in the read operation, the potentials of bit lines BL and $\overline{BL}$ are determined according to the data stored in the selected memory cell. The difference of the potentials on bit lines BL and $\overline{BL}$ is sensed by a sense amplifier (not shown) to detect the data. On the other hand, in the write operation, the potentials of bit lines BL and $\overline{BL}$ are determined by a writing circuit (not shown). According to "1" or "0" of the potential level, "1" or "0" data is written in the selected memory cell.

During the clearing operation on the other hand, control signal CC is "1". When the clear data signal CD is "1", first and second output nodes $N_3$ and $N_4$ are set to $V_{DD}$ and $V_{SS}$ potentials, respectively. During the clearing operation, transistors $T_3$ and $T_4$ for the transfer gate are turned off. Assume that a memory cell, for example, $MC_{11}$, stores data "0" before the clearing operation. In this state, node $N_1$ in memory cell $MC_{11}$, i.e., the drain of drive transistor $T_1$ is set to the low level ($V_{SS}$), while node $N_2$ in memory cell $MC_{11}$, i.e., the drain of drive transistor $T_2$ is set to the high level (substantially $V_{DD}$). Furthermore, drive transistor $T_1$ is turned on and drive transistor $T_2$ is turned off. In the circumstance, when nodes $N_3$ and $N_4$, i.e., the sources of drive transistors $T_1$ and $T_2$, become $V_{DD}$ and $V_{SS}$, respectively, the level of node $N_1$ becomes high. Consequently, drive transistor $T_2$ is turned to ON and, thus, the level of node $N_2$ changes from the high level to the low level. Thus, data "1" is written in memory cell $MC_{11}$. The capacitance of node $N_2$ is so small that the discharge current for charges stored in node $N_2$ is also small. The clearing operation is carried out simultaneously for all memory cells $MC_{11}$, $MC_{12}$, . . . associated with the column connected to the first and second output nodes $N_3$ and $N_4$ of clearing operation control circuit 10, so that all the memory cells $MC_{11}$, $MC_{12}$, . . . associated with the same column are stored with data "1" at the same time.

During the clearing operation, when clear data signal CD is "0", first and second output nodes $N_3$ and $N_4$ are set to $V_{SS}$ and $V_{DD}$ potentials, respectively. During the clearing operation, transistors $T_3$ and $T_4$ for the transfer gate are turned off. Assume that a memory cell, for example, $MC_{11}$, stores data "0" before the clearing operation. In this state, node $N_1$ in memory cell $MC_{11}$, i.e., the drain of drive transistor $T_1$ is set to the low level ($V_{SS}$), while node $N_2$ in memory cell $MC_{11}$, i.e, the drain of drive transistor $T_2$ is set to the high level (substantially $V_{DD}$). Furthermore, drive transistor $T_1$ is turned on and drive transistor $T_2$ is turned off. In the circumstance, even when nodes $N_3$ and $N_4$, i.e., the sources of drive transistors $T_1$ and $T_2$, become $V_{SS}$ and $V_{DD}$, respectively, the level of node $N_1$ is kept low. Consequently, drive transistor $T_2$ is 25 also kept OFF, and, thus, the level of node $N_2$ the high level. Thus, data "0" is kept in memory cell $MC_{11}$.

Figure 3:
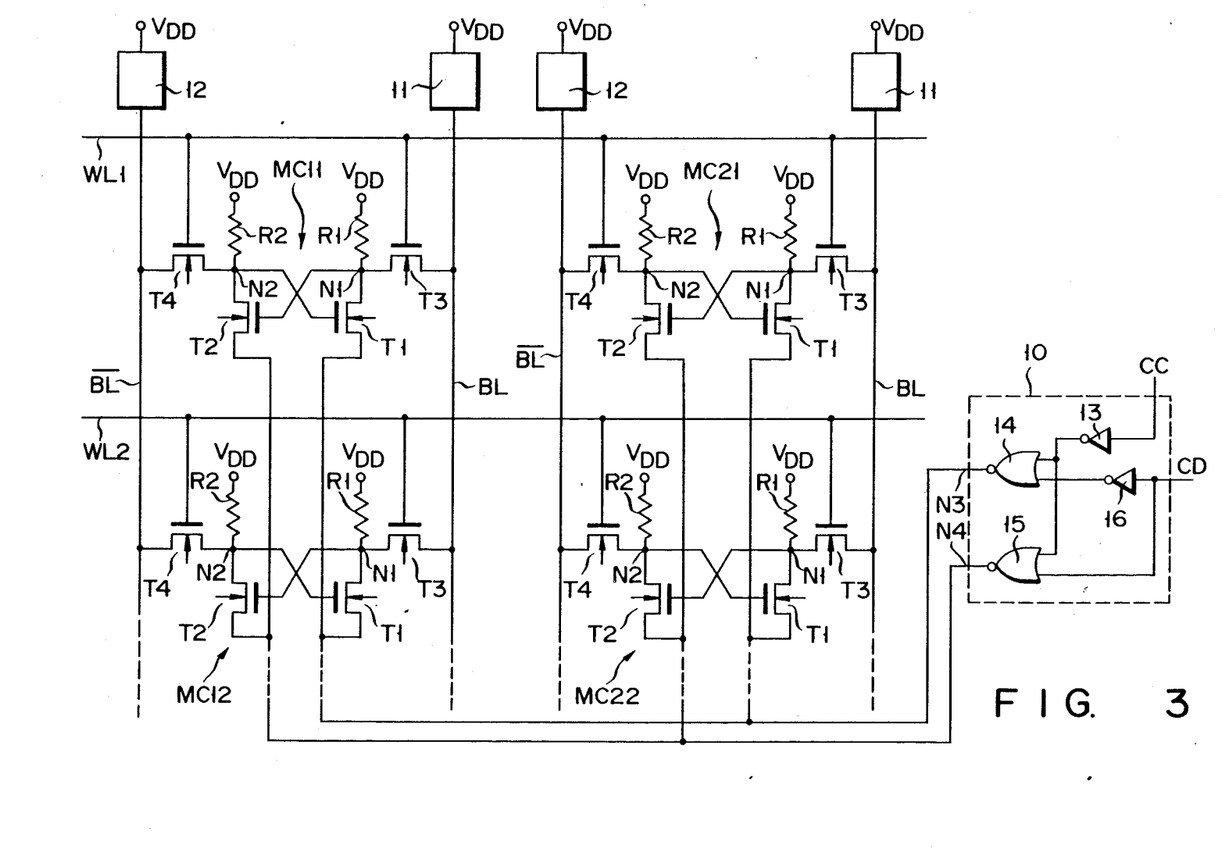
FIG. 3 is a circuit diagram of a memory section and a control circuit for clearing data, of a semiconductor memory according to another embodiment of the present invention.

According to the embodiment of FIG. 2, the clearing operation is carried out for a minimum unit of 1 column in the memory cell matrix. However, the clearing operation may also be performed at a time for a unit of several columns, as shown in FIG. 3. FIG. 3 shows a circuit by which the clearing operation is carried out at a time for a unit of two columns. Control circuit 10 is connected commonly to each of the memory cells of the two columns.

In the embodiment of FIG. 3, the clearing operation is carried out for a unit of two columns. However, the operation may be carried out for a unit of three or more columns. Alternatively, the clearing operation may also be performed for a unit of all columns in the memory cell matrix. In such a case, a single control circuit 10 may be connected commonly to all the columns.

Figure 4A:
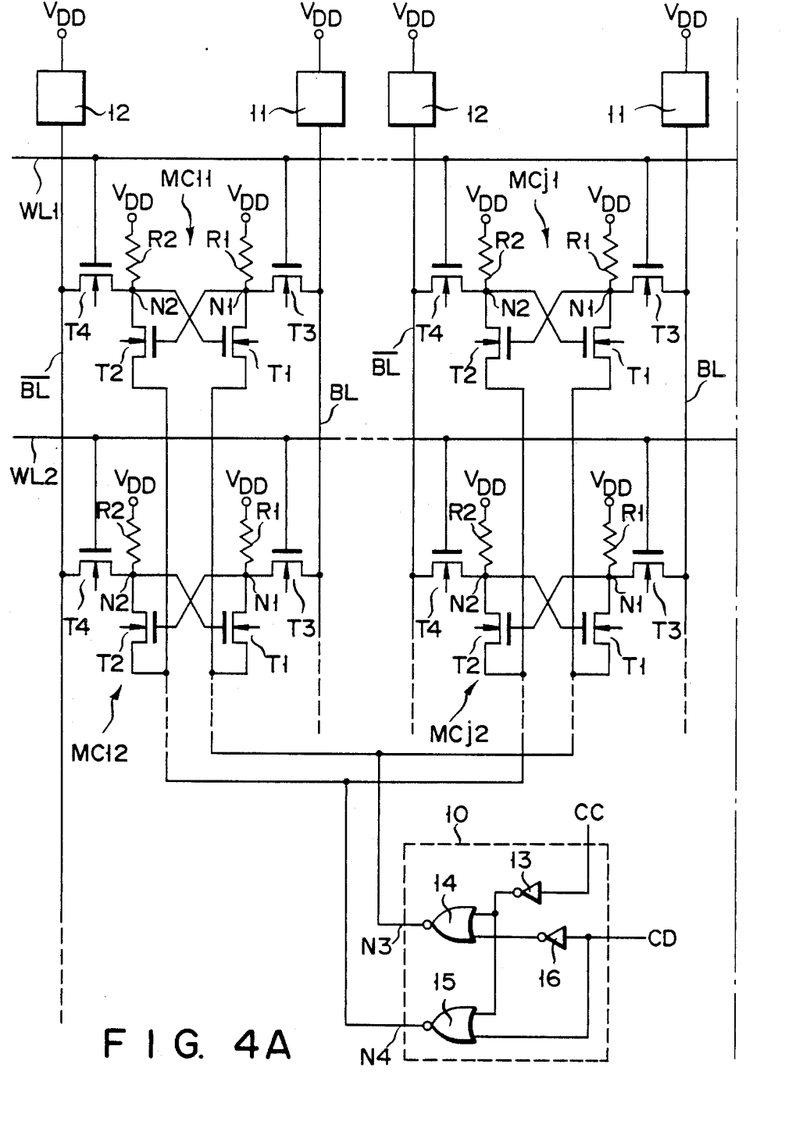
FIGS. 4A and 4B show a circuit diagram showing a memory section and a control circuit for clearing data, of a semiconductor memory according to still another embodiment of the present invention.
Figure 4B:
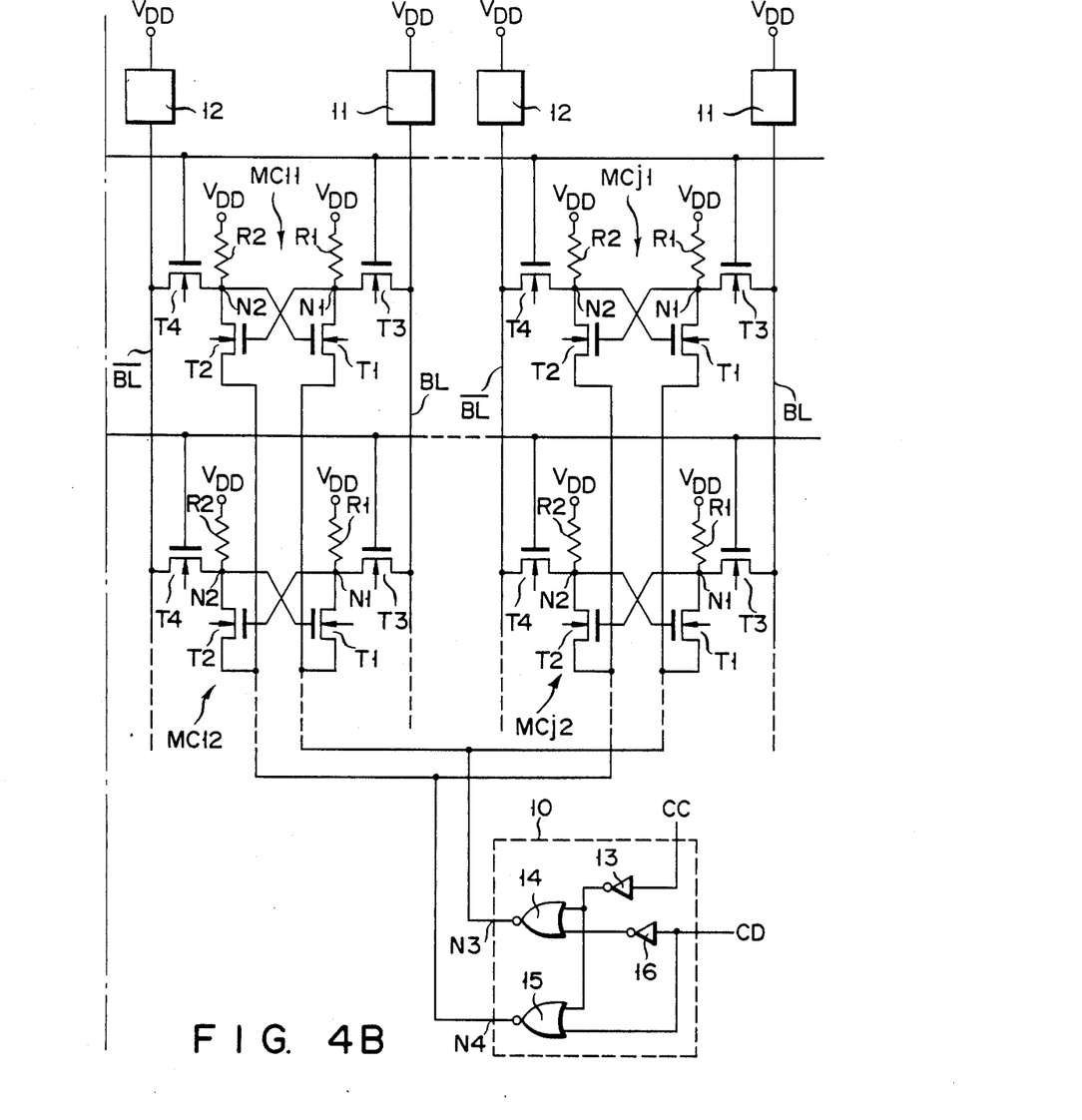

FIGS. 4A and 4B show a memory device where j columns are gathered as a unit, and a control circuit 10 is provided for each of the column units.

Figure 5A:
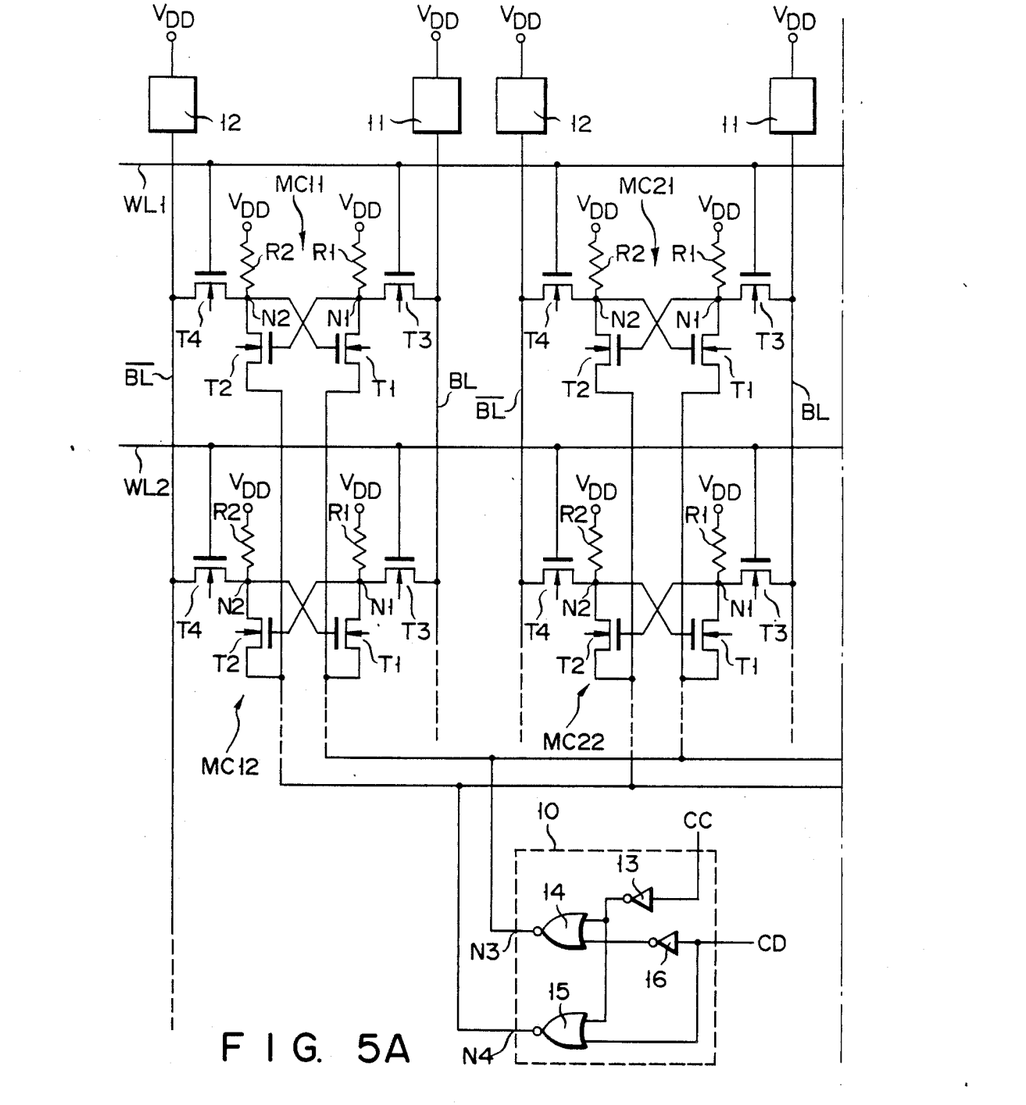
FIGS. 5A and 5B show a circuit diagram illustrating a memory section and a control circuit for clearing data, of a semiconductor memory according to still another embodiment of the present invention.
Figure 5B:
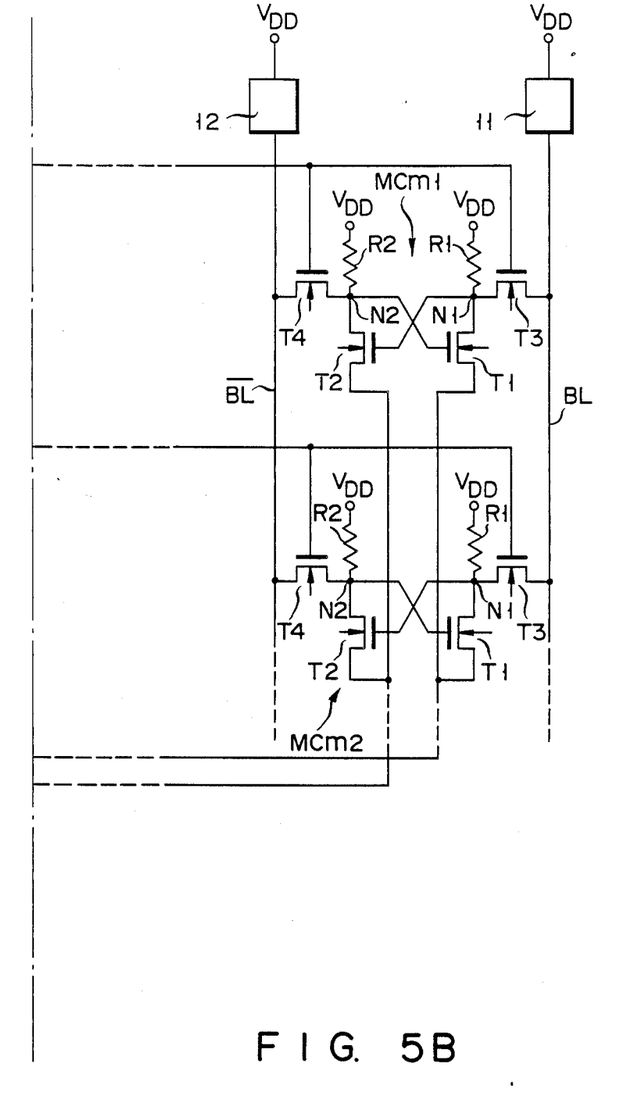

FIGS. 5A and 5B show a memory device where a single control circuit 10 is provided commonly to all columns in the memory matrix.

Clearing operation control signal CC is normally generated based on an input signal supplied from an external system of the memory chip. However, if the memory device is designated such that, when the power supply of the memory chip is switched on, clearing operation control signal CC becomes high level and clearing data signal CD becomes a desired level ("1" or "0"). Data corresponding to clearing data signal CD of a desired level can be written in the memory cell upon switching the power supply ON.

Figure 6:
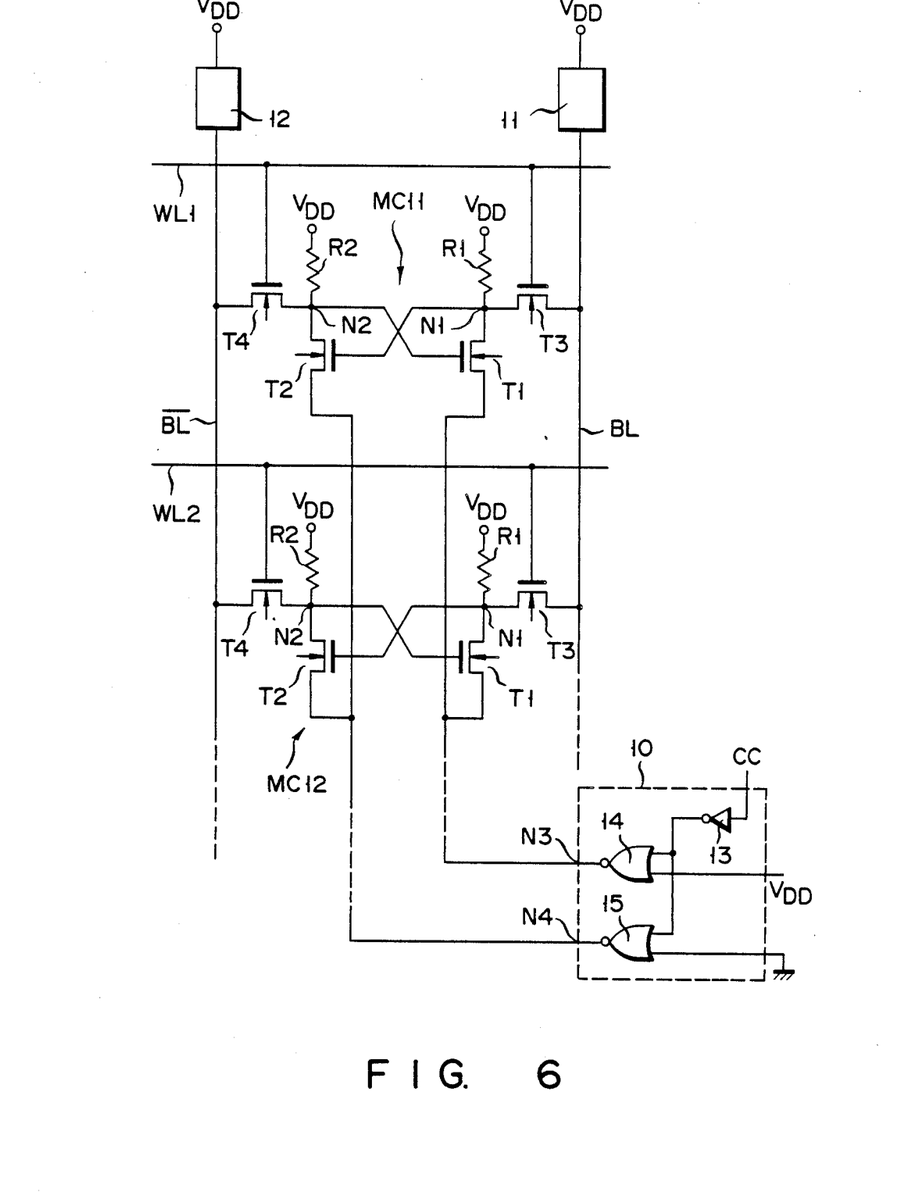
FIG. 6 illustrates another configuration of the control circuit associated with the semiconductor memory in each of the embodiments of FIGS. 2, 3, 4A, 4B, 5A and 5B.

Control circuit 10 can be configured as shown in FIG. 6, provided that data to be written in node $N_1$ of the flip-flop circuit is limited to "0" when control signal CC is "1".

Figure 7:
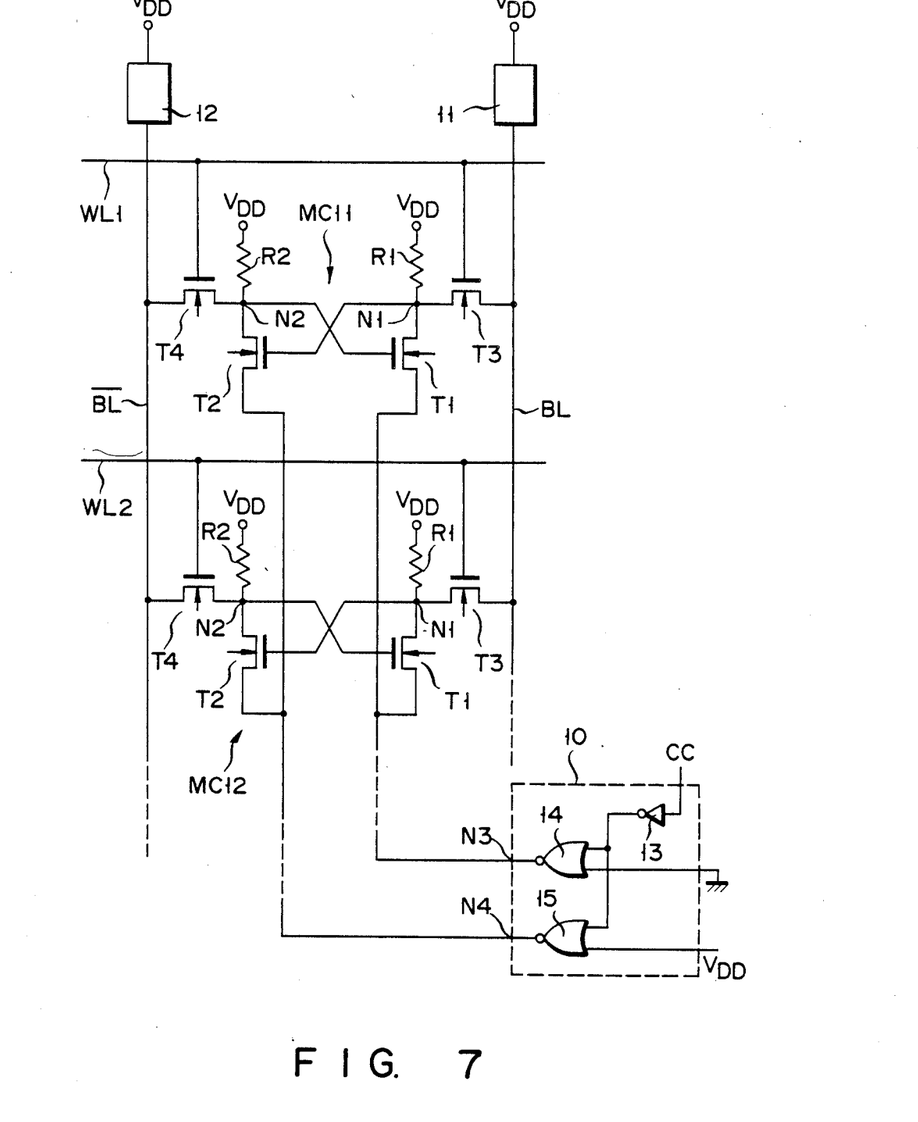
FIG. 7 represents still another configuration of the control circuit associated with the semiconductor memory in each of the embodiments of FIGS. 2, 3, 4A, 4B, 5A and 5B.

While control signal CC is "1" when data to be written in node $N_1$ of the flip-flop circuit is limited only to "1", control circuit 10 can be constituted by a circuit shown in FIG. 7.

Figure 8:
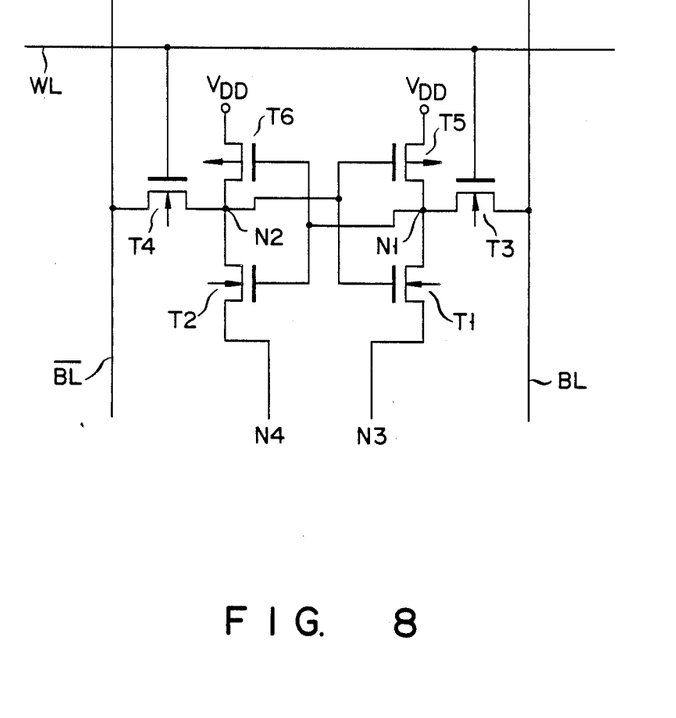
FIG. 8 shows another circuit diagram of each of the memory cells of the semiconductor memories according to the embodiments of the present invention.

In the above mentioned embodiments, each of memory cells $MC_{11}$, $MC_{12}$, . . . may be replaced by a memory cell having such a structure as shown in FIG. 8. In the memory cell of FIG. 8, the load elements are formed of P channel MOS transistors $T_5$ and $T_6$, and the drive elements are formed of N channel MOS transistors $T_1$ and $T_2$. The sources of P channel MOS transistors $T_5$ and $T_6$ are connected to $V_{DD}$ potential. The sources of N channel MOS transistors $T_1$ and $T_2$ are connected to the first and second output nodes $N_3$ and $N_4$ of control circuit 10 (not shown in FIG. 8), respectively. The drain of P channel MOS transistor $T_5$ is connected to the drain of N channel MOS transistor $T_1$. The drain of P channel MOS transistor $T_6$ is connected to the drain of N channel MOS transistor $T_2$. The gates of P and N channel MOS transistors $T_5$ and $T_1$ are interconnected and connected to the node of the drains of P and N channel MOS transistors $T_6$ and $T_2$. The gates of P and N channel MOS transistors $T_6$ and $T_2$ are interconnected and connected to the node of the drains of P and N channel MOS transistors $T_5$ and $T_1$. MOS transistor $T_3$ used as a transfer gate is inserted between the node of the drains of P and N channel MOS transistors $T_5$ and $T_1$, on one hand, and bit line BL, on the other hand. The gate of MOS transistors $T_3$ is connected to word line WL. MOS transistor $T_4$ used as a transfer gate is inserted between the node of the drains of P and N channel MOS transistors $T_6$ and $T_2$, on one hand, and bit line $\overline{BL}$ on the other hand. The gate of MOS transistors $T_4$ is connected to word line WL.

Figure 9:
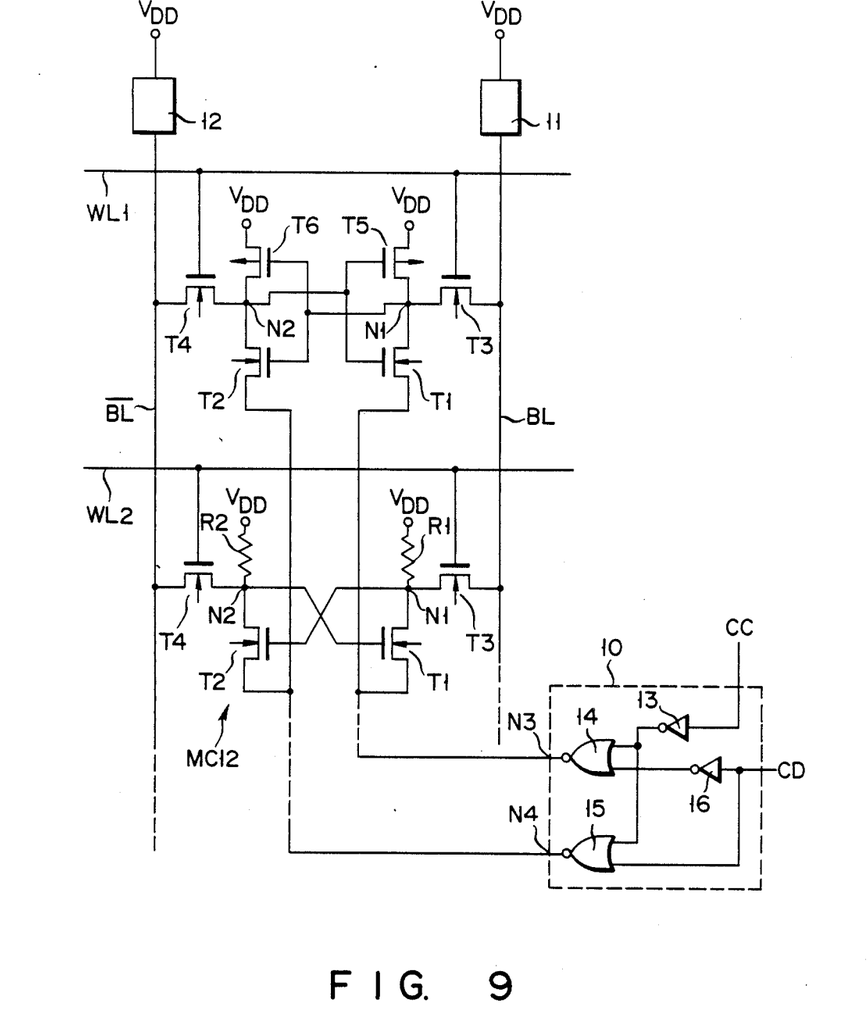
FIG. 9 is a circuit diagram of a memory section and a control circuit for clearing data, of a semiconductor memory according to a still further embodiment of the present invention.

FIG. 9 shows a circuit diagram of a semiconductor memory according to a still further embodiment of the present invention, in which the memory cell of FIG. 8 is used in place of the memory cell of the semiconductor memory shown in FIG. 2.

The SRAM provided with the clearing operation control circuit has many advantages as follows.

(1) Processing time for the clearing operation is greatly reduced. Specifically, no address selecting operation is required for selecting the memory cells during the clearing operation. Moreover, the clearing operation can be applied to a minimum unit of 1 column, with the result that the clearing processing time is greatly reduced compared with that as in a prior SRAM in which the writing operation must be repeated by the same number of times as the number of bits to be cleared. For example, where the numbers of rows and columns of the memory cell matrix per input/output device are both m, the processing time in the foregoing embodiments becomes at least $m/m^2 = 1/m$ times that in the prior art SRAM as shown in FIG. 1.

(2) Power required for the clearing operation is remarkably reduced. Specifically, during the clearing operation in the SRAM of the prior art as shown in FIG. 1, current $i_3$ which is the sum of current $i_1$ and current $i_2$ flows, current $i_1$ flowing through the power node of $V_{DD}$ potential, - load transistor $T_{21}$ on the bit line, - bit line BL - memory cell MC (transistor $T_{23}$ for a transfer gate, and - drive transistor $T_{25}$) and - $V_{SS}$ potential, and current $i_2$ flowing through the $V_{DD}$ potential power node, - load transistor $T_{21}$ on the bit line, - bit line BL, - data write circuit (writing transistor $T_{27}$ and - writing data line DL) and - $V_{SS}$ potential. Current $i_3$ normally becomes about 1 milliampere per column. Therefore, with a 256 k bit SRAM having 512 columns, as large DC current as several ten milliamperes flows during write operation. In the above embodiments on the other hand, the clearing operation is carried out while maintaining transistors $T_3$ and $T_4$ for the transfer gate of memory cells $MC_{11}$, $MC_{12}$, . . . OFF, with the result that DC current flows only through a high-resistance load $R_1$ or $R_2$ in the memory cell. Consequently, even when data stored in all memories are simultaneously cleared, only current equal to that flowing in the waiting mode (normally several microamperes) flows.

(3) No address selecting operation is required for selecting the memory cells during the clearing operation. On the contrary, the prior art SRAM requires an additional circuit for selecting all rows and columns in order to clear data stored in all memory cells.

(4) The number of additional circuits required for the clearing operation is reduced. More specifically, no memory cell selecting operation is required during the clearing operation, so that the address decoder system of the SRAM need not be modified from that of the conventional SRAM and, consequently, no additional circuits for selecting an address are required. Furthermore, although the clearing operation control circuits are required, the number of required clearing operation control circuits is at most the same as the number of columns. When data stored in all memory cells are simultaneously cleared, it suffices that only one control circuit is provided.

(5) It is possible to clear data in a minimum unit of 1 column in the clearing operation. Moreover, a simultaneous clearing can also be performed in the units of several columns. Furthermore, a simultaneous clearing of all columns (all memory cells) can also be performed.

(6) "1" or "0" data can be selectively cleared by clearing data signal CD.

With the semiconductor memory according to the present invention as described above, the processing time and the power consumption spent during the clearing operation of data, can be greatly reduced. Therefore, the semiconductor memory can be advantageously applied to the image processing field of technical art where a highspeed processing operation is required.

What is claimed is:

1. A semiconductor memory device comprising:
    a plurality of memory cells arranged in the form of a matrix constituted by a plurality of rows and columns, each memory including a flip-flop circuit constituted by two load elements and two drive MOS transistors connected respectively to said load elements, and two transfer gate transistors connected respectively to drains of said two MOS transistors; and
    potential level-setting means which receives a data clear signal and a clear control signal and, in accordance with the clear control signal, designates a data-clear mode, and in a data-clear mode sets a source of one of said two drive MOS transistors in each of the memory cells associated with at least one of said columns to a high potential level, and a source of the other of said two drive MOS transistors to a low potential level on the basis of the data clear signal.

2. The semiconductor memory device according to claim 1, in which said potential level-setting means sets, in a data clear mode, a source of one of said two drive MOS transistors in each of the memory cells associated with two or more of said columns, to a high potential level, and sets a source of the other of said two drive MOS transistors to a low potential level.

3. The semiconductor memory device according to claim 1, in which said potential level-setting means sets, in a data-clear mode, a source of one of said two drive MOS transistors in each of the memory cells associated with all of said columns, to a high potential level, and sets a source of the other of said two drive MOS transistors to a low potential level.

4. The semiconductor memory device according to claim 1, in which said potential level-setting means switches the potential level of the source of each of said two drive MOS transistors, according to a potential level of a clearing data signal.

5. The semiconductor memory device according to claim 1, in which said potential level-setting means comprises a first inverter, for receiving said clear control signal, a second inverter, for receiving said data clear signal, a first NOR gate, for receiving the output signals of said first and second inverters, an output terminal of the first NOR gate being connected to the source of one of said two drive MOS transistors in each memory cell, and a second NOR gate, for receiving the output signal of said first inverter and said data clear signal, an output terminal of the second NOR gate being connected to the source of the other of said two drive MOS transistors.

6. The semiconductor memory device according to claim 1, in which said potential level-setting means comprises an inverter for receiving said clear control signal, a first NOR gate, for receiving an output signal of said inverter and a power source signal, an output terminal of the first NOR gate being connected to the source of one of said two drive MOS transistors in each memory cell, and a second NOR gate, for receiving the output signal of said inverter and a reference signal, an output terminal of the second NOR gate being connected to the source of the other of said two drive MOS transistors.

* * * * *